US007196363B2

(12) United States Patent
Montagnana

(10) Patent No.: US 7,196,363 B2
(45) Date of Patent: Mar. 27, 2007

(54) MULTILAYER METAL STRUCTURE OF SUPPLY RINGS WITH LARGE PARASITIC CAPACITANCE

(75) Inventor: Marco Montagnana, Cormano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/456,940

(22) Filed: Jun. 6, 2003

(65) Prior Publication Data

US 2004/0041268 A1    Mar. 4, 2004

(30) Foreign Application Priority Data

Jun. 7, 2002    (EP) ................... 02425376

(51) Int. Cl.
*H01L 27/10* (2006.01)
(52) U.S. Cl. ............... 257/207; 257/208; 257/209; 257/210; 257/758
(58) Field of Classification Search ........ 257/691–692, 257/207–211, 503, 750, 700, 532–533, E23.153, 257/E23.144; 361/306.1, 306.3, 309–310, 361/302
See application file for complete search history.

(56) References Cited

U.S. PATENT DOCUMENTS

| 4,914,503 | A |   | 4/1990  | Shirato et al.              |
|-----------|---|---|---------|-----------------------------|
| 4,989,062 | A | * | 1/1991  | Takahashi et al. ... 257/207 |
| 5,583,359 | A | * | 12/1996 | Ng et al. ............ 257/306 |
| 5,765,279 | A | * | 6/1998  | Moresco et al. ....... 29/840 |
| 5,774,326 | A | * | 6/1998  | McConnelee et al. .. 361/313 |
| 5,864,177 | A | * | 1/1999  | Sundstrom ........... 257/723 |
| 5,949,098 | A |   | 9/1999  | Mori                        |
| 6,016,000 | A | * | 1/2000  | Moslehi ............... 257/522 |
| 6,066,537 | A | * | 5/2000  | Poh ..................... 438/393 |
| 6,104,080 | A | * | 8/2000  | Ehben ................. 257/532 |
| 6,218,729 | B1 | * | 4/2001 | Zavrel et al. ........ 257/698 |
| 6,252,177 | B1 | * | 6/2001 | Stoddard ............. 174/260 |
| 6,285,050 | B1 | * | 9/2001 | Emma et al. ......... 257/296 |
| 6,300,161 | B1 | * | 10/2001 | Goetz et al. ......... 438/106 |

(Continued)

FOREIGN PATENT DOCUMENTS

EP    0 532 305 A2    3/1993

(Continued)

OTHER PUBLICATIONS

European Search Report for EP 02 42 5376, Nov. 14, 2002.

*Primary Examiner*—Thao X. Le
(74) *Attorney, Agent, or Firm*—Lisa K. Jorgenson; John M. Janeway; Graybeal Jackson Haley LLP

(57) ABSTRACT

A multilayer metal supply rings structure of an integrated circuit comprises at least two parallel perimetral metal rails defined in metal layers of different levels, geometrically superposed one to the other. Each rail is constituted by using definition juxtaposed modules, each module defining on a metal layer parallel segments, longitudinally separated by a separation cut, of each rail, superposed rails of said multilayer structure constituting one supply node being electrically interconnected through a plurality of interconnection vias through dielectric isolation layers between different metal levels. A feature of the multilayer metal supply rings structure is that the segments of each of said perimetral metal rails modularly defined on each metal level belong alternately to one and another supply node upon changing the metal level. A process of defining a multilayer metal supply rings structure is also disclosed.

9 Claims, 3 Drawing Sheets

U.S. PATENT DOCUMENTS

| | | |
|---|---|---|
| 6,344,961 B1 * | 2/2002 | Naito et al. .................. 361/302 |
| 6,365,954 B1 * | 4/2002 | Dasgupta .................... 257/532 |
| 6,385,033 B1 * | 5/2002 | Javanifard et al. ....... 361/306.2 |
| 6,424,022 B1 * | 7/2002 | Wu et al. .................... 257/665 |
| 6,445,564 B1 * | 9/2002 | Naitoh .................... 361/301.2 |
| 6,452,781 B1 * | 9/2002 | Ahiko et al. ............. 361/321.2 |
| 6,470,545 B1 * | 10/2002 | Branchevsky .............. 29/25.42 |
| 6,476,497 B1 * | 11/2002 | Waldron et al. ............ 257/775 |
| 6,496,354 B2 * | 12/2002 | Naito et al. .............. 361/306.1 |
| 6,559,544 B1 * | 5/2003 | Roth et al. .................. 257/758 |
| 6,577,494 B2 * | 6/2003 | Watanabe et al. ........ 361/321.2 |
| 6,777,755 B2 * | 8/2004 | Humphrey et al. ......... 257/360 |
| 6,794,729 B2 * | 9/2004 | Mori et al. .................. 257/532 |

FOREIGN PATENT DOCUMENTS

| | | |
|---|---|---|
| EP | 0 644 594 A1 | 3/1995 |
| JP | 02005550 | 1/1990 |
| JP | 04116850 * | 4/1992 |
| JP | 2000349238 A * | 12/2000 |

* cited by examiner

US 7,196,363 B2

MULTILAYER METAL STRUCTURE OF SUPPLY RINGS WITH LARGE PARASITIC CAPACITANCE

PRIORITY CLAIM

This application claims priority from European patent application No. 02425376.7, filed Jun. 7, 2002, which is incorporated herein by reference.

TECHNICAL FIELD

The present invention relates generally to integrated circuits, and in particular to integrated devices including, totally or in part, digital circuits and a certain number of input/output circuits (I/O).

BACKGROUND

The impetuous development of integrated electronic systems encounters, among others, problems due to the necessary compacting together of sub-systems, circuits, and devices that occasionally may interfere with each other causing malfunctionings of various natures.

In general, electromagnetic compatibility becomes of paramount importance if the effect of disturbances and interferences jeopardizes safety. In certain fields of use of electronic systems such as, for instance, in the automotive industry, aeronautics, biomedics, and the like, electronic devices must be immune to disturbances and at the same time they must not generate noise and disturbances that could affect nearby devices.

The techniques for reducing interference phenomena among distinct electronic devices have become very expensive and they are not always able to meet certain rules of electromagnetic compatibility.

Manufacturers of integrated circuits are pressed to design devices capable of minimizing compatibility problems at the source. In particular, digital devices must generate very little noise, while analog devices must be robust and insensitive as possible to environmental noise.

The "intelligent" part of monolithically integrated systems typically comprises digital circuitry operating with signals of very high frequency, and this is often a source of high-energy noise.

There are different techniques for reducing and confining electromagnetic emissions of an integrated digital circuit. The realization of decoupling filters from supply lines represents the first thing to do for this objective. The simplest decoupling filter consists of a capacitor of relatively large capacitance. This implies the requisite of a commensurate silicon area which notably may become rather costly.

Contrary to the most general design rule, in developing the circuit layouts such to minimize capacitive couplings among different circuit lines (nodes), for the objectives of implementing and effective decoupling from the supply lines, the addressed problem is that of maximizing the capacitive coupling between the two equipotential supply nodes of an integrated circuit while minimizing the silicon area to be spent to this end.

Often, digital devices have numerous input/output (I/O) structures normally realized along the whole or part of the perimeter of the chip by replicating a typical definition module for an I/O interface by the number of input/output pads. Such a definition module is substantially composed of two distinct portions:

1) a portion for defining the I/O circuitry to be realized that commonly comprises the driver, the pre-driver and the control logic of the output stage, eventual Schmitt triggers, and the relative logic control circuitry of the input stage;
2) a portion for defining the supply lines that comprise (at least) two distinct and relatively wide segments of metal rails for the supply (i.e., equipotential nodes $V_{DD}$ and $V_{SS}$, respectively).

The two segments of supply lines of each module (that is of the definition mask of the relative metal) relative to an input/output circuit or cell concur to modularly compose perimetral supply rings. Obviously, at locations where the realization of an I/O cell is not contemplated, the definition module (or more precisely, only the portion of it for defining the metal patterning mask) called "filler cell", will define only segments of the supply lines.

Modern fabrication processes contemplate numerous levels of metallization (up to six/seven levels according to the most recent fabrication technologies), and only the first two levels are in general used to interconnect the circuitry, while the other metals are dedicated to the distribution of the supply voltages to ensure a substantial equipotentiality of the supply node even in presence of large current absorptions.

In particular, the two segments of supply lines of the numerous I/O cells and of eventual filler cells are parallel to each other and all the respective levels of similarly patterned metals overlay one another and are connected together to ensure as much as possible equipotentiality of the so constituted multilayered supply nodes. FIG. 1 depicts such a multilayer metallization structure of such supply rings of an integrated circuit.

FIG. 1 depicts the structure of supply and ground (or negative supply) metallizations according to a fabrication technology that contemplates the presence of up to six metal levels: the four top levels being exploited for distributing the supply to the various functional circuits that are integrated on the chip.

Accordingly, at least along the perimeter of the chip, where the I/O interface cells are integrated, four (or more) superposed metals are interconnected, to constitute a first supply node ($V_{DD}$) and as many metals are interconnected to constitute a second or virtual ground node ($V_{SS}$).

Such a modular multilayer metal structure is replicated tens or hundreds of times in an integrated device, often along all four sides of the chip. By placing the modules (I/O and/or filler cell) side by side, multilayer metal rings are realized: one for $V_{DD}$ and one for $V_{SS}$.

If I/O cells must be realized at regular intervals along each side of the integrated device and not adjacently with neighboring cells (for example, because of assembling requirements in a particular package or because the number of I/O circuits, and, thus, the number of definition modules to be replicated is not large enough to cover the full length of a side of the chip), cells of pure interconnection (filler-cells) that do not include any circuitry, but consists only of segments of metallization lines are defined such to ensure continuity of the two (or more) supply rings.

FIG. 2 depicts a typical layout of I/O modules and/or "filler cells".

The capacitance between the so constituted parallel lines of $V_{DD}$ and $V_{SS}$, even if both are realized in the form of a multilayer, is not particularly high because the capacitive coupling is low. Such a structure of parallel metal planes interconnected together even if well suited to satisfy the low impedance requisite of the supply lines (i.e., equipotentiality of the two nodes), does not contribute to constitute an effective decoupling filter of the noise generated by the high frequency switchings of the digital circuits and in particular of the I/O circuits, which must be done by integrating dedicated circuit means.

Moreover, the typical multilayer structure of the supply rings of the I/O circuits illustrated in FIGS. 1 and 2 precludes any possibility of using the silicon area occupied by these multilayered supply lines for other purposes, such as, for realizing decoupling capacitors. On the other hand, this area is not negligible because the width of the supply rails must be commensurate to support a current of hundreds of milliamperes or even a current of few amperes during peaks of power absorption, for instance, at switchings of the logic circuits.

The ever increasing cost that is attributed to the unity of silicon area calls for structures that, whenever possible, besides providing the functionality for which they are realized, allow exploitation of the same integration area also for other objectives for reducing costs.

SUMMARY

An embodiment of the present invention provides an effective solution to the above discussed technical problems for overcoming the inefficiencies and drawbacks of the known approaches.

According to this embodiment of the invention, it is possible to obtain values of capacitance between two multilayer supply rings of up to two orders of magnitude greater than the values of parasitic capacitance that is measured in the multilayer metal structures of known devices, without any appreciable increase of silicon area occupied for achieving such a large increase of the capacitive coupling between the two equipotential supply nodes.

A feature of the multilayer metal structure of supply rings for an integrated circuit including digital circuitry of this embodiment of the invention is that the two segments of the supply rails relating to the two supply nodes, which are simultaneously and modularly defined along the perimeter of the integration area of the circuit on the chip, on each level of metal used for realizing multilayer supply nodes extended along the whole or part of the perimeter of the integration area, belong, as the level changes, alternately to one or the other supply node.

Through a layout of the multilayer metal structure of the supply rings according to the process of fabrication of this embodiment of the invention, it is possible to obtain a superposition of segments of the two metallization rails of the supply rings in an alternate mode effective in providing for the maximum capacitive coupling between the two equipotential supply nodes in terms of coupling area, while ensuring, at the same time, relatively low impedance (resistance) of the lines to satisfy the equipotentiality requisite of each supply node.

The large capacitance that is realized between the two multilayer supply nodes, structured according to this embodiment of the present invention, is effective in filtering the switching noise that, notably, is, to a large extent, generated by the input/output circuits, thus, preventing the injection of noise through the supply lines to other circuits and other devices that are particularly sensitive, such as analog circuits, as well as to reduce the level of electromagnetic emissions.

BRIEF DESCRIPTION OF THE DRAWINGS

The different aspects and advantages of the invention will appear even more evident through the following description of several embodiments and by referring to the attached drawings, wherein.

DETAILED DESCRIPTION

Figure 3A:
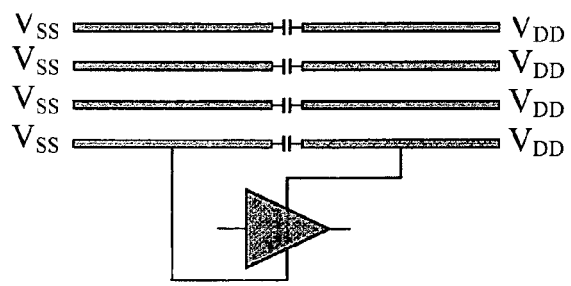
FIG. 3a is a sectional view of two multilayer supply rings realized according to a known technique.
Figure 3B:
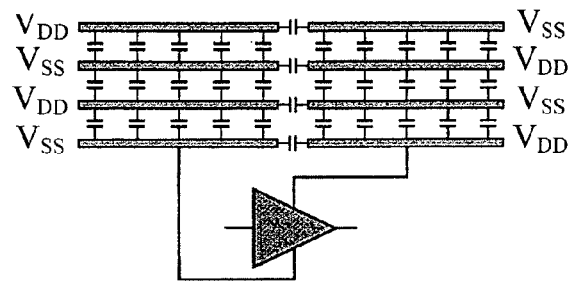
FIG. 3b is a sectional view of two multilayer supply rings realized according to an embodiment of the present invention.

For better distinguishing among capacitive couplings that contribute to establish a certain capacitance between the two equipotential supply nodes constituted by parallel multilayer supply rails or most often by two concentric supply rings, FIGS. 3a and 3b compare a cross section of a known multilayer supply rings structure (FIG. 3a) and of a structure made according to an embodiment of the invention (FIG. 3b).

In the cross sections, symbols of capacitive coupling are indicated between the two supply nodes $V_{SS}$ and $V_{DD}$, through which functional circuits, for instance, one or more input/output circuits, depicted in FIGS. 3a and 3b by the symbol of a buffer are powered.

Figure 1:
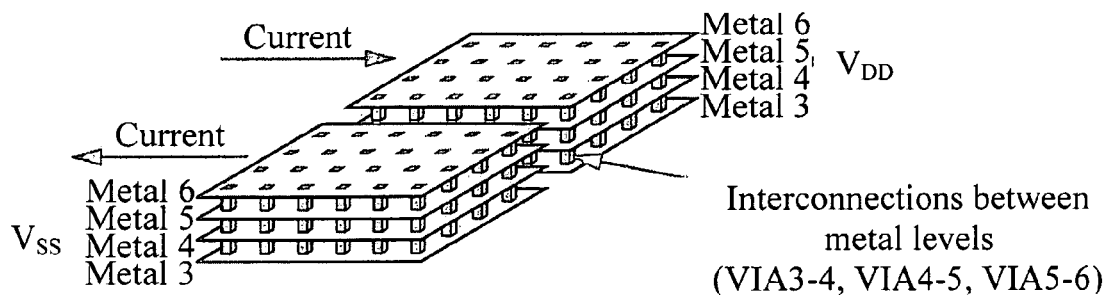
FIG. 1 shows, as discussed hereinbefore, a typical conventional multilayer structure of two supply rings.
Figure 2:
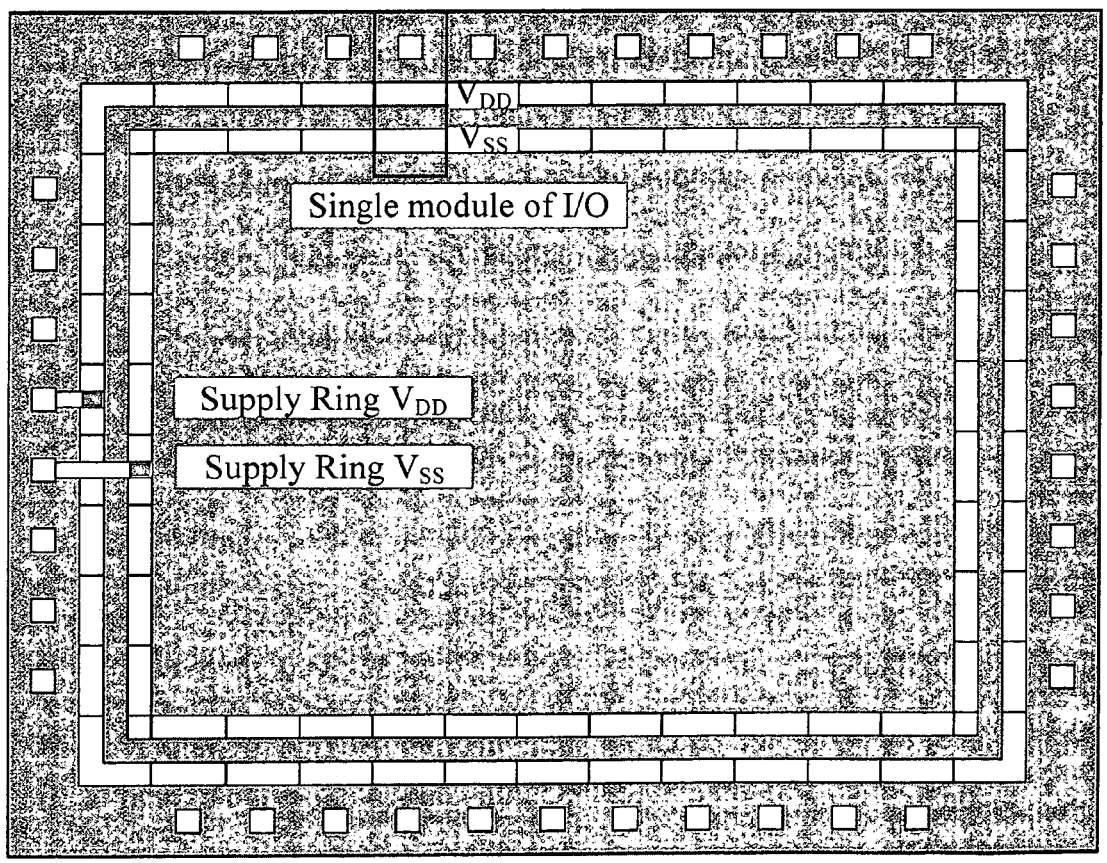
FIG. 2 is a plan view of conventional supply rings modularly defined for a certain number of I/O circuits along the four sides of the perimeter of a chip.

As it may be observed from the layout organization of input/output structures, as schematically illustrated in FIG. 2, that couple the internal circuitry of the device to the external world, the connection pads (pins) to the external world are, in general, spacingly distributed along the four sides of the perimeter of the supply rings $V_{DD}$ and $V_{SS}$.

These pads of $V_{DD}$ and $V_{SS}$ may be at distances of several millimeters from one to the other (depending on the current consumption characteristics of the device) and this implies that the voltage drop on the relative portion of supply ring may not be negligible.

According to the known structure (FIG. 3a) of these multilayer supply rings, the equipotentiality requisite, even in presence of remarkable currents, is ensured by minimizing the voltage drop along the patterned metal line portion by designing an adequate conducting metal cross section of the composite conducting line that is purposely constituted on several metallization planes, the patterned lines of which are electrically connected together by a plurality of interconnected vias spacingly formed along the whole ring.

Maximizing the capacitive coupling by alternately superposing patterned metal lines belonging to one and the other of the two supply nodes has so far been recognized as impracticable because it would preclude the possibility of establishing with continuity a great number of electrical interconnection vias among the metal planes belonging to the same supply node of the multilayer structure of supply rings. The impracticality of establishing numerous electrical contacts could cause non-negligible voltage differences among the different metal planes of the same supply node. Indeed, the different metal planes would be connected together only in correspondence of the external connections (pads) (that, as said before, may be at a distance of a millimeter or even more).

It should be remarked that to meet particular requisites of fabrication process of the device, the different metal levels may often have different thicknesses (generally different conducting sections). This causes different and specific resistance per unit of length of the relative patterned metal line. As a consequence, with the same length and width of definition, two superposed supply lines or rails (on different metal levels) and, thus, defined by metallization layers of different characteristics, may have different impedances and, thus, different voltage drops that may cause undesired current recirculations and injections along the relative supply ring and especially in correspondence of the point of external connection (pads).

It should also be remarked the fact that the logic input/output circuitry supplied through perimetral supply rings exploits the presence of multilayer conductors for the connections of the functional circuits to the supply voltage and to ground (i.e., to the two supply nodes). Commonly this connection is made to the immediately overhanging metal level (see the scheme of FIGS. 3a and 3b) and should the possibility of electrically connecting these functional circuits also to the other levels of the multilayer structure of the supply rings locally, the advantage of having multilayer conductors of augmented conducting cross section would be jeopardized.

All these problems are brilliantly overcome by a structure realized according to this embodiment of the present invention because, while on one side, a maximized capacitive coupling between the two supply nodes is substantially achieved, on the other side, the equipotentiality condition of the two nodes (of the two multilayer conductor structures) of the supply rings is achieved by a plurality of electrical interconnection vias that may be uninterruptedly formed along the whole perimetral rings to connect together patterned metal lines belonging to the same supply node even if they are defined on geometrically superposed but alternate metal planes.

This arrangement, meeting the requisites of large capacitive coupling and equipotentiality is obtained according to the process of fabrication of an embodiment of the invention, by using two distinct modules of definition of the relative metal masks that are alternately used for realizing the multilayer structure of perimetral supply metal rings of an integrated circuit.

Figure 4:
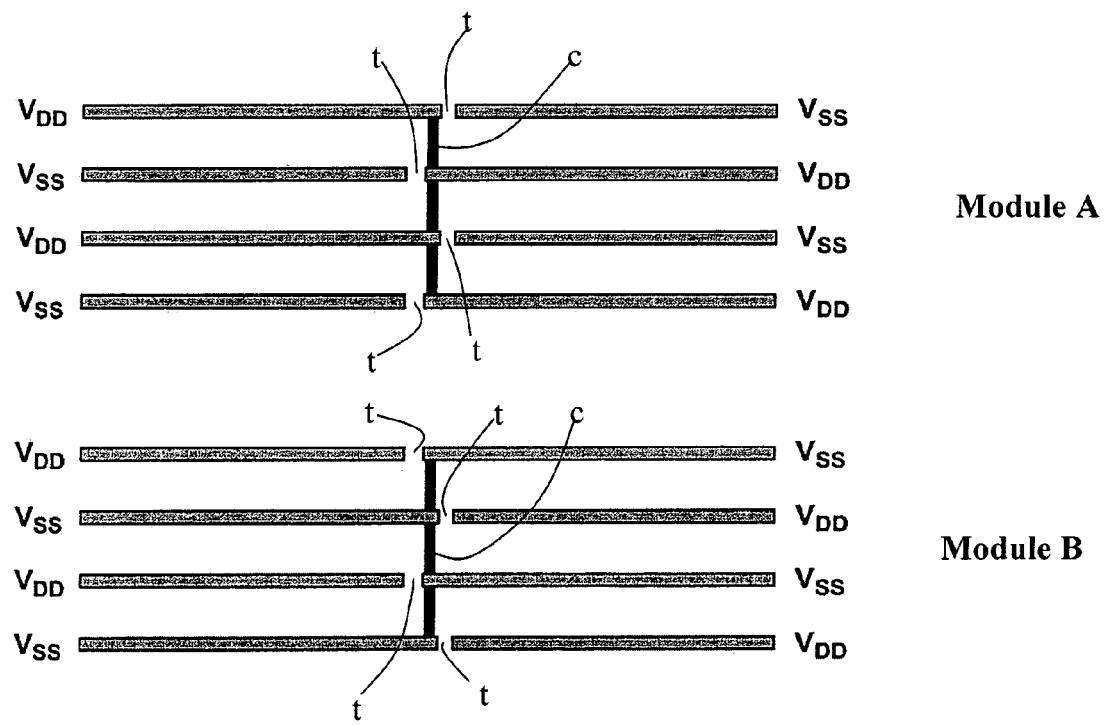
FIG. 4 is a sectional view of multilayer supply rings defined by I/O structure modules and/or by "filler cells" modules, by alternating the polarity at every different level for constituting multilayer supply rings according to an embodiment of the present invention.

A first embodiment of a pair of definition modules alternately employed for realizing the multilayer structure of supply rings is depicted in FIG. 4.

According to this first embodiment, the longitudinal separation cuts t between a first and a second segment, respectively, of metal lines or rails relative to the two supply nodes $V_{DD}$ and $V_{SS}$ that are modularly defined on each of the metal levels used to constitute the supply rings, are staggered, one in respect to the other, in an alternate manner, from one metal level to the next.

The staggering of the position of the longitudinal separation cut t between the patterned metal segment relative to a virtual ground node ($V_{SS}$) and the patterned metal segment relative to the supply node ($V_{DD}$), which the modularly composed metal definition mask establishes on each metallization plane, allows the realization of a plurality of columnar interconnection vias c that connect electrically together the edges of all the $V_{DD}$ segments, in the case of the module A, and the edges of all the $V_{SS}$ segments in the case of the module B.

In this way, the module A provides for the possibility of locally connecting (for the whole length of definition of the module) all the $V_{DD}$ metal planes together by one, or better, a certain number of columns of interconnection vias c realized (preferably, as will be discussed hereinafter) along the substantially central longitudinal axis of the metal definition module, for reaching and connecting together all the different $V_{DD}$ metal levels. In this module A (defining a portion or segment of the multilayer perimetral supply rings structure), the metal planes of the other supply node $V_{SS}$ are not interconnected among them.

Vice versa, this happens in correspondence of the module B that is used adjacently to each module A, in an alternate fashion, to define the relative metal patterning mask. The module B establishes a complementary situation to that established by the module A, that is, whereby one or more columns of interconnection vias c, also in this case realized along a substantially central longitudinal axis of the module, connect together all the patterned metal levels of $V_{SS}$.

Figure 5:
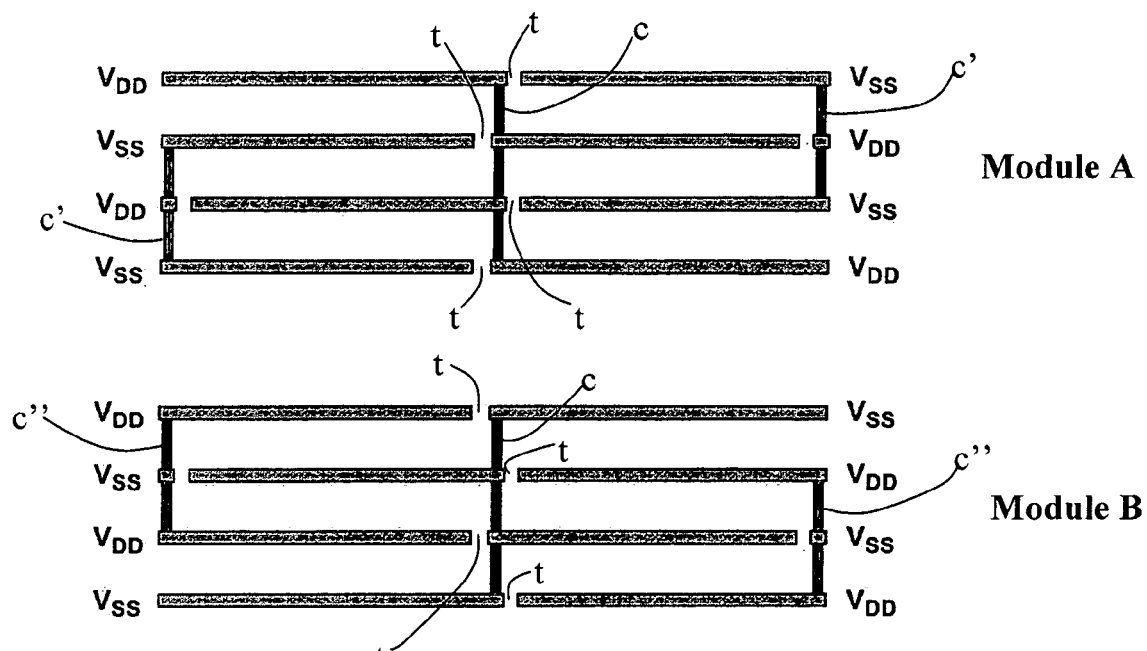
FIG. 5 depicts an alternative embodiment of the metal lines definition modules alternately used for realizing multilayer supply rings according to an embodiment of the present invention.

An alternative embodiment is depicted in FIG. 5.

According to this alternative embodiment of defining each metal patterning mask to realize the multilayer perimetral metal supply rings structure of an integrated circuit, the module A, besides the interconnection of all planes $V_{DD}$ through the full-height columns c of interconnection vias, provides also for a partial interconnection, realized by the vias c', among different $V_{SS}$ planes. Complementary, the module B provide for the interconnection of all the $V_{SS}$ planes through the full height columns c of interconnection vias and a partial interconnection of $V_{DD}$ planes through the vias c".

While there is not any substantial difference between the two embodiments in terms of obtained coupling capacitance, the embodiment of FIG. 5 permits a more uniform distribution of the electrical interconnections among the metal planes belonging to the same supply node along the whole extension of the conductor ring, though requiring a slightly more complex layout.

In fact, while in the embodiment of FIG. 4, in correspondence with a connection of the supply rings with the external world through respective $V_{DD}$ and $V_{SS}$ pads, the connection may be realized very simply by using a specially modified definition module according to the scheme of the module A for a connection to the pad $V_{DD}$ and a specially modified module of definition according to the scheme of the module B for a connection to the pad $V_{SS}$. In the alternative embodiment of FIG. 5, a more complex layout is typically designed for realizing an effective connection to the pads implying also the definition of appropriate electrical connections to the relative adjacent modules (in one case to module of type A and in the other case of a module of type B).

According to a structure as that of the two examples depicted in FIGS. 4 and 5, in which the realization of column of vias c is contemplated along a central longitudinal axis of the distinct definition modules, the separation cut t of a segment of $V_{DD}$ rail from a parallel co-planar segment of $V_{SS}$ rail on each metal plane may be connected through the borders d between a definition module and the successive, by joining cuts t' that preferably may be defined inclined of 45° through the border line d between adjacent modules such to create angles greater than 90° in the patterned metal lines, less critical both from an electrical point of view as well as from a technological point of view of the definition process of these metal lines.

Figure 6:
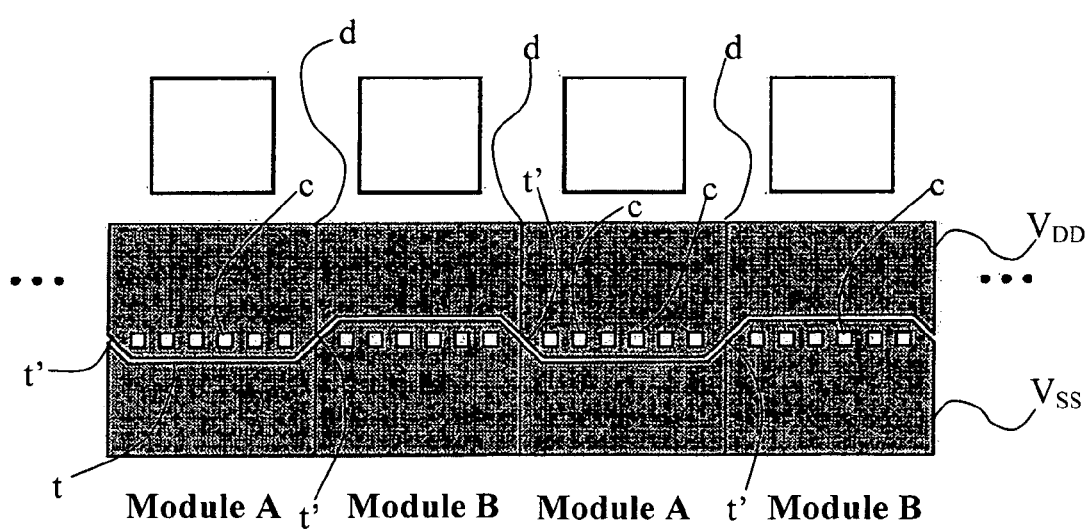
FIG. 6 is a schematic plan view of a portion of multilayer supply rings for a device having a plurality of I/O circuits according to an embodiment of the present invention.

This embodiment is schematically depicted in FIG. 6.

By defining a zig-zag shape to the longitudinal separation cut t+t'+t+ . . . between the $V_{DD}$ rail and the $V_{SS}$ rail on each metal plane of the multilayer supply rings structure, the area of capacitive coupling between the two equipotential supply nodes is increased relative to the prior art.

As may be easily recognized, the embodiments of the invention allow for an optimal exploitation of silicon area for realizing a high filter capacitance between the two equipotential supply nodes, by exploiting, for this function, an efficiently augmented parasitic capacitance of a perimetral multilayer metal structure of I/O cells supply rings, to reduce at the source the level of electromagnetic emissions of a large scale integration digital circuit.

The capacitance that is obtained with a metal-rings structure according to the above embodiments of the invention is about one hundred times the parasitic capacitance that may be measured in a known structure with parallel and interconnected planes of the same dimensions and physical characteristics.

This exceptional advantage has been quantified for the process that has been used for testing the validity of this embodiment of the invention. A capacitive ratio of about 100 emerged from comparative measurements of parasitic parameters carried out on devices realized with supply rings made according to the known technique and according to this embodiment of the invention in the case of a 0.18 µm CMOS process.

The embodiments of the invention shown in FIGS. 4–6 may be implemented in an integrated circuit that is part of a large electronic system. For example, a memory may have a supply ring structure shown in FIGS. 4–6, and may be coupled to a processor to form a computer system or portion thereof.

From the foregoing it will be appreciated that, although specific embodiments of the invention have been described herein for purposes of illustration, various modifications may be made without deviating from the spirit and scope of the invention.

What is claimed is:

1. An integrated circuit, comprising:
   first and second layers;
   a first power supply conductor disposed in the first layer and coupled to carry a first supply voltage;
   a second power supply conductor disposed in the first layer and coupled to carry a second supply voltage;
   a third power supply conductor disposed in the second layer, overlapping the first power supply conductor, and coupled to carry the second supply voltage;
   a fourth power supply conductor disposed in the second layer, overlapping the second power supply conductor, and coupled to carry the first supply voltage;
   third and fourth layers;
   a fifth power supply conductor disposed in the third layer, overlapping the third power supply conductor, and coupled to carry the first supply voltage;
   a sixth power supply conductor disposed in the third layer, overlapping the fourth power supply conductor, and coupled to carry the second supply voltage;
   a seventh power supply conductor disposed in the fourth layer, overlapping the fifth power supply conductor, and coupled to carry the second supply voltage;
   an eighth power supply conductor disposed in the fourth layer, overlapping the sixth power supply conductor, and coupled to carry the first supply voltage;
   wherein the first power supply conductor has an edge adjacent to the second power supply conductor;
   wherein the second power supply conductor has an edge opposite the first power supply conductor;
   wherein the third power supply conductor has an edge opposite the fourth power supply conductor;
   wherein the fourth power supply conductor has an edge adjacent to the third power supply conductor;
   wherein the fifth power supply conductor has an edge adjacent to the sixth power supply conductor;
   wherein the sixth power supply conductor has an edge opposite the fifth power supply conductor;
   wherein the seventh power supply conductor has an edge opposite the eighth power supply conductor;
   wherein the eighth power supply conductor has an edge adjacent to the seventh power supply conductor;
   a first conductive via that electrically couples the edge of the first power supply conductor to the edges of the fourth, fifth, and eighth power supply conductors;
   a second conductive via that electrically couples the edge of the third power supply conductor to the edge of the seventh power supply conductor; and
   a third conductive via that electrically couples the edge of the second power supply conductor to the edge of the sixth power supply conductor.

2. An integrated circuit, comprising:
   first and second layers;
   a first power supply conductor disposed in the first layer and coupled to carry a first supply voltage;
   a second power supply conductor disposed in the first layer and coupled to carry a second supply voltage;
   a third power supply conductor disposed in the second layer, overlapping the first power supply conductor, and coupled to carry the second supply voltage;
   a fourth power supply conductor disposed in the second layer, overlapping the second power supply conductor, and coupled to carry the first supply voltage;
   third and fourth layers;
   a fifth power supply conductor disposed in the third layer, overlapping the third power supply conductor, and coupled to carry the first supply voltage;
   a sixth power supply conductor disposed in the third layer, overlapping the fourth power supply conductor, and coupled to carry the second supply voltage;
   a seventh power supply conductor disposed in the fourth layer, overlapping the fifth power supply conductor, and coupled to carry the second supply voltage;
   an eighth power supply conductor disposed in the fourth layer, overlapping the sixth power supply conductor, and coupled to carry the first supply voltage;
   wherein the first power supply conductor has an edge opposite the second power supply conductor;
   wherein the second power supply conductor has an edge adjacent to the first power supply conductor;
   wherein the third power supply conductor has an edge adjacent to the fourth power supply conductor;
   wherein the fourth power supply conductor has an edge opposite the third power supply conductor;
   wherein the fifth power supply conductor has an edge opposite the sixth power supply conductor;

wherein the sixth power supply conductor has an edge adjacent to the fifth power supply conductor;
wherein the seventh power supply conductor has an edge adjacent to the eighth power supply conductor;
wherein the eighth power supply conductor has an edge opposite the seventh power supply conductor;
a first conductive via that electrically couples the edge of the second power supply conductor to the edges of the third, sixth, and seventh power supply conductors;
a second conductive via that electrically couples the edge of the first power supply conductor to the edge of the fifth power supply conductor; and
a third conductive via that electrically couples the edge of the fourth power supply conductor to the edge of the eighth power supply conductor.

3. An integrated circuit, comprising:
first and second layers;
a first power supply conductor disposed in the first layer and coupled to carry a first supply voltage;
a second power supply conductor disposed in the first layer and coupled to carry a second supply voltage;
a third power supply conductor disposed in the second layer, overlapping the first power supply conductor, and coupled to carry the second supply voltage;
a fourth power supply conductor disposed in the second layer, overlapping the second power supply conductor, and coupled to carry the first supply voltage;
third and fourth layers;
a fifth power supply conductor disposed in the third layer, overlapping the third power supply conductor, and coupled to carry the first supply voltage;
a sixth power supply conductor disposed in the third layer, overlapping the fourth power supply conductor, and coupled to carry the second supply voltage;
a seventh power supply conductor disposed in the fourth layer, overlapping the fifth power supply conductor, and coupled to carry the second supply voltage;
an eighth power supply conductor disposed in the fourth layer, overlapping the sixth power supply conductor, and coupled to carry the first supply voltage;
a first conductive via that electrically couples the first power supply conductor to the fourth, fifth, and eighth power supply conductors;
a second conductive via that electrically couples the third power supply conductor to the seventh power supply conductor; and
a third conductive via that electrically couples the second power supply conductor to the sixth power supply conductor.

4. An integrated circuit, comprising:
first and second layers;
a first power supply conductor disposed in the first layer and coupled to carry a first supply voltage;
a second power supply conductor disposed in the first layer and coupled to carry a second supply voltage;
a third power supply conductor disposed in the second layer, overlapping the first power supply conductor, and coupled to carry the second supply voltage;
a fourth power supply conductor disposed in the second layer, overlapping the second power supply conductor, and coupled to carry the first supply voltage;
third and fourth layers;
a fifth power supply conductor disposed in the third layer, overlapping the third power supply conductor, and coupled to carry the first supply voltage;
a sixth power supply conductor disposed in the third layer, overlapping the fourth power supply conductor, and coupled to carry the second supply voltage;
a seventh power supply conductor disposed in the fourth layer, overlapping the fifth power supply conductor, and coupled to carry the second supply voltage;
an eighth power supply conductor disposed in the fourth layer, overlapping the sixth power supply conductor, and coupled to carry the first supply voltage;
a first conductive via that electrically couples the second power supply conductor to the third, sixth, and seventh power supply conductors;
a second conductive via that electrically couples the first power supply conductor to the fifth power supply conductor; and
a third conductive via that electrically couples the fourth power supply conductor to the eighth power supply conductor.

5. A multilayer metal supply ring structure of an integrated circuit comprising at least two parallel perimetral metal rails defined in each metal layer of plurality of metal layers of different levels, isolated by dielectric layers and geometrically superposed one to the other, each rail being constituted by a succession of juxtaposedly defined alternated modules on each metal layer, each module defining parallel segments of each of said parallel perimetral metal rails, longitudinally separated by a continuous separation cut having a longitudinal portion alternately offset on one side and on the other side of a median line of separation in the succession of juxtaposed alternating modules defined on each metal layer;
alternately superposed rail segments of said multilayer structure being electrically interconnected by interconnection vias through said dielectric layers constituting a respective supply node;
a plurality of said interconnecting vias being longitudinally aligned along said median line of separation and intercepting staggered edges along said alternately offset longitudinal portion of the separation cut of said parallel rail segments, along the succession of juxtaposed alternated modules at the different metal levels, for alternately connecting superimposed rail segments to one and the other of said supply nodes upon changing metal level;
wherein said sideway alternately offset longitudinal portion of the continuous separation cut between said parallel segments of a module geometrically joins with the longitudinal portion of the separation cut of an adjacent juxtaposed module through joining cuts inclined at 45°, crossing the border between the adjacent juxtaposed modules.

6. The multilayer metal supply ring structure of claim 5, wherein additional pluralities of interconnection vias through two of said dielectric layers of isolation electrically connecting together staggered side edges of segments of rails of a same supply node along lateral sides of said two parallel perimetral metal rails.

7. A process of defining a multilayer metal supply ring structure of an integrated circuit according to claim 5, characterized in that the preparation of a definition mask for patterning each of said metal layers of different level comprises the steps of:
defining and using at least two complementary definition mask modules alternately juxtaposed one to the other for defining parallel segments of each of at least two parallel perimetral metal rails of said metal supply ring structure on each metal layer, separated by a continuous separation cut having a longitudinal portion alternately offset on one side and on the other side of a median line of separation in the succession of juxtaposed alternated modules of definition on each metal layer and joining cuts crossing the border between adjacent juxtaposed modules;

alternating the stacking alignment of the two complementary definition mask modules in patterning successively deposited metal layers;

defining and forming a plurality of interconnecting vias longitudinally aligned along said median line of separation for intercepting staggered edges along said alternately offset longitudinal portion of the separation cut of the parallel rail segments, along the succession of juxtaposed alternated modules at the different metal levels, for alternately connecting alternately stacked rail segments to one and the other of said supply nodes upon changing metal level, interconnecting vias being longitudinally aligned along said median line of separation and intercepting staggered edges along said alternately offset longitudinal portion of the separation cut of said parallel rail segments along the succession of juxtaposed alternated modules at the different metal levels for alternately connecting superimposed rail segments to one and the other of said supply nodes upon changing the metal level.

8. The process according to claim 7, wherein at locations along said perimetral supply rings where an input/output circuit must be realized, said two complementary mask modules define also connections of the respective input/output circuit with the respective segments of the supply rails.

9. An integrated circuit containing all or in part digital circuitry and comprising a switching noise filter capacitor connected between the two supply nodes, wherein said filter capacitor is the parasitic capacitance between said two supply nodes having a multilayer metal supply rings structure as defined in claim 5.

* * * * *